INVENTOR.
EDWARD S. STEIN &
ARTHUR W. HOLT
BY Joseph A. Genovese &
Max L. Libman
ATTORNEYS

STACKED CIRCUIT BOARDS

Filed March 8, 1962

3 Sheets-Sheet 2

INVENTOR.
EDWARD S. STEIN &
ARTHUR W. HOLT
BY Joseph A. Genovese &
Max L. Libman
ATTORNEYS July 27, 1965 E. S. STEIN ET AL 3,197,766

STACKED CIRCUIT BOARDS

Filed March 8, 1962 3 Sheets-Sheet 3

INVENTOR.
EDWARD S. STEIN &
ARTHUR W. HOLT

BY Joseph A. Genovese &
Max L. Libman

ATTORNEYS 3,197,766

STACKED CIRCUIT BOARDS

Edward S. Stein, Washington, D.C., and Arthur W. Holt, Silver Spring, Md., assignors, by mesne assignments, to Control Data Corporation, Minneapolis, Minn., a corporation of Minnesota Filed Mar. 8, 1962, Ser. No. 178,453
3 Claims. (Cl. 340—378)

This invention relates to assembly and fabrication techniques, and particularly to the manufacture of electronic equipment using printed circuits.

The terms "printed circuit" and "printed circuit boards" are used herein to mean any panel, board, or other kind of support for one or more components, where circuit connections on the board are made by conductive material adhered to the board surface by any method such as etching, spraying, electrodeposition, embossing, etc. Thus, in accordance with our definition, the circuit board conductors can be formed by additive or subtractive processes. Although hand or machine-wired boards (e.g., stitched) are not technically "printed," as used herein "printed" includes such boards as a matter of convenience, i.e., to avoid repeating the various alternatives each time that we use the term in the description and claims.

The printed circuit art is very old, but has been in extensive commercial use from the early or middle part of 1940. Since that time numerous patents have been issued for new methods of manufacturing printed circuit boards, special configurations thereof, on connectors for attaching components to the boards, and connectors for connecting the conductors of boards themselves in circuit. The invention is principally concerned with the latter subject matter, that is, the connections of the boards themselves in circuit with other boards or with any other external circuit.

Printed circuit boards have many uses. In some instances, for example in the manufacture of a television or radio receiver, a printed circuit board may be the major part of the chassis of the receiver. Since there is only one circuit board involved, there is no great difficulty in mounting the board and, of course, no requirement that the circuit board be connected to another circuit board. In other equipment, such as in electronic computers, electronic character reading machines, etc. a very large number of separate circuit boards are required. The following example is given to place the invention in proper perspective. We are helping to construct an optical scanning reading machine capable of being used as a computer input device. The reading machine has approximately 2,000 printed circuit boards, and edge connector such as shown in U.S. Patent No. 2,937,357 (or the equivalent) is required for each circuit board. The circuit board connectors require a very large amount of hand wiring, to say nothing of the cost of the edge connectors themselves. An object of this invention is to provide a greatly simplified system for both mechanically and electrically connecting printed circuit boards in an assembly.

Another object of our invention is to provide a new technique for assembling printed circuit boards, where the technique is far more economical than previous techniques, both from parts-cost and assembly-cost standpoints.

The above objectives are achieved by eliminating the edge-connector concept for the various leads of a printed circuit board, and by substituting a new procedure where the individual circuit boards are connected with a plurality of pins which pass through openings through the circuit boards. The pins can be arranged in various ways, an exemplary manner being to stake or otherwise attach the pins to an insulating base so that the pins remain in a parallel array. The circuit boards each have apertures which are so spaced that the boards may be inserted flatwise onto the pins with the pins passing completely through the apertures. In this way, any practical number of circuit boards can be inserted on the same set of pins.

To establish electrical connections, the pins are connected with an external circuit or circuits and the components supported by the boards are suitably connected with contacts which are attached to the boards in or adjacent to the board-apertures. Thus, electrical continuity is from the pins, to the connectors of the boards, from the connectors to the components on the boards, and from the components to output leads which may be one or more of the previously mentioned pins, or flying leads attached to the individual boards.

Taking a specific example, assume that there are 400 pins and 30 circuit boards stacked on the pins. This means that there will be in the one assembly 12,000 electrical connections all made by inserting 30 boards on the pins. Each connection affords a tie-point for at least one component. With ordinary edge connectors having, for example, 40 terminals each, 300 edge connectors would be required for an equivalent number of contact points. Just the 300 edge connectors would be very costly. In addition, more than 12,000 taper pins would be required if an edge connector such as in U.S. Patent No. 2,937,357 were used. With our system in the example under consideration, we would require only 400 input connections (one to each pin) and, a minimum of 30 output connections (one to each circuit board) unless some of the previously mentioned pins are used as outputs. We mention a minimum of 30 output connections to the individual printed circuit boards, but this number will increase depending on the design of the equipment with which the invention is used. However, the number would not ordinarily even approach the minimum of 12,000 taper pin connections required with conventional edge connectors.

The above example entails a comparatively large number of circuit boards, i.e. thirty. If our array of pins can be equated to a single edge connector, it is then evident that twenty-nine of the circuit boards are mounted and connected in circuit without additional cost. Thus, our system is economically practical whether there are only one or two boards involved, or 30, 40 or more. A corollary feature of the invention is that once a base with its pins are furnished, any number (within the limits established by length of the pins themselves) of circuit boards may be inserted on the array of pins.

To more clearly demonstrate only one of many practical uses of the invention, reference is made to the J. Rabinow application Serial No. 115,267, entitled Non-Scanning Character Reader, which discloses an optical reading machine using resistor matrices as correlation devices to develop signals on which to base the decision as to the identity of an unknown character. Each matrix is composed of a plurality of resistors, and as disclosed in the pending application more than one matrix can and preferably is used for each character to be identified. These matrices from an excellent example of how the invention only only will lead to a saving in time, effort and money but also will provide other advantages.

As disclosed in the pending application, and later discussed herein, there is a definite positional relationship (in some reading machines) between what come into the view of the scanner (or other examination device) for the unknown character, and other sections of the machine, for example the correlation devices. By using our invention we can (as will be shown later) relate both the position and the identity of the correlation matrix for each character with an unknown character being examined. For example, we can position a character correlation matrix (circuit board with the correlation resistors thereon) high or low, to the left or to the right, on the array of pins to correspond to a high, low, etc. examination of an unknown character. Also, the identity of the character with which a correlation matrix is operative, can be immediately ascertained by the designer or maintenance personnel by observation of the boards. The resistors of the matrix are arranged in a pattern which is the same as the shape of the character to which it corresponds.

We emphasize that the reading machine-use of the invention is given by way of example only and that we have invented a system which has many more uses. Anywhere that circuit boards must be mounted and electrically connected to other circuit boards and/or to external circuits, our method of using an array of pins and inserting the boards thereon may be used with the accompanying advantages of simplicity of design, fabrication and of economy.

Other objects and features of importance will become apparent in following the description of the illustrated forms of the invention.

Figure 3:
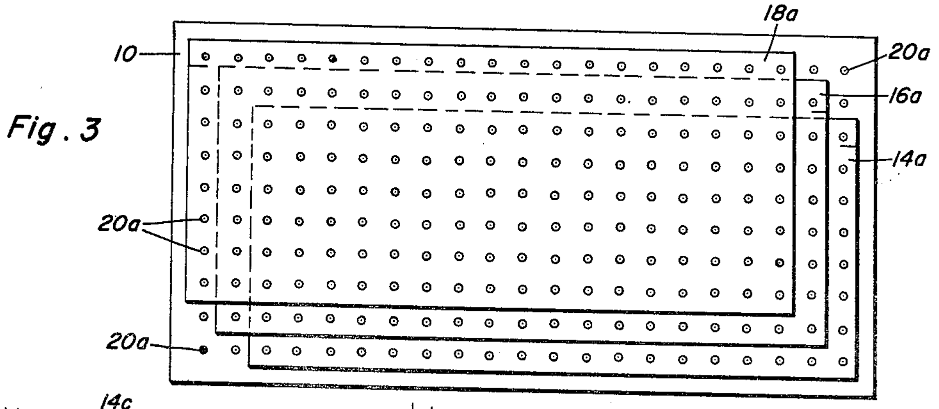
FIGURE 3 is a top diagrammatic view showing the assembly where only three circuit boards are used, this view also showing that the circuit boards can be placed in different positions on the same array of pins.
Figure 3A:
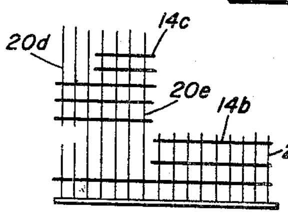
Figure 3B:
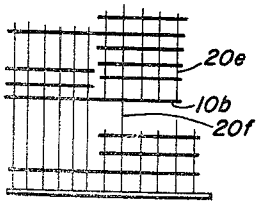

FIGURES 3*a* and 3*b* are diagrammatic side views having the flexibility of the assembly.

Figures 4, 4A, 5, 5A:
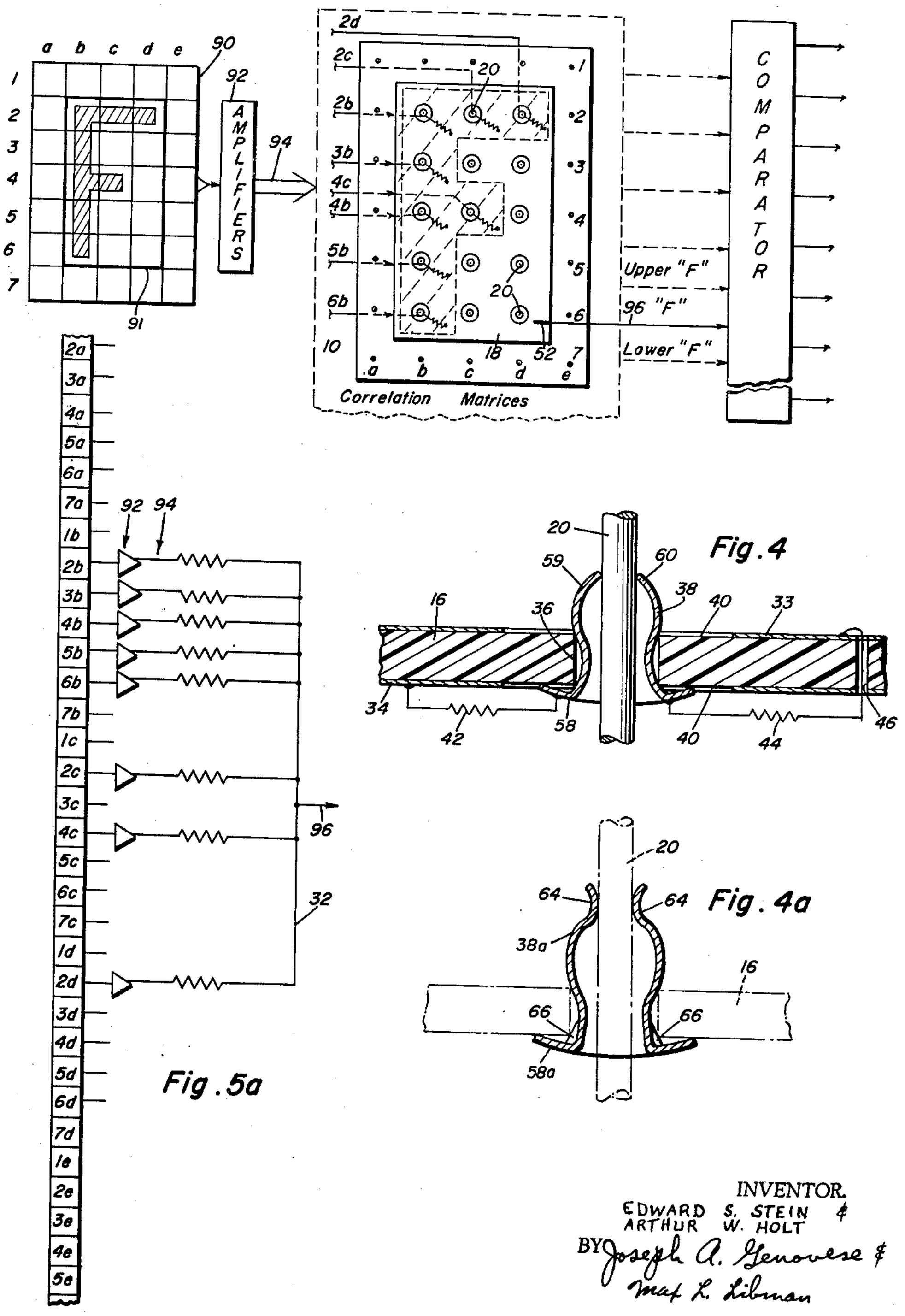

FIGURE 4 is an enlarged sectional view showing one type of pin-to-board connector and also showing specifically how components can be attached to the conductors on the circuit board and so connected that they are in circuit with one of the pins.

FIGURE 4*a* is a sectional view showing a modification of the connector of FIGURE 4.

Figure 4B:
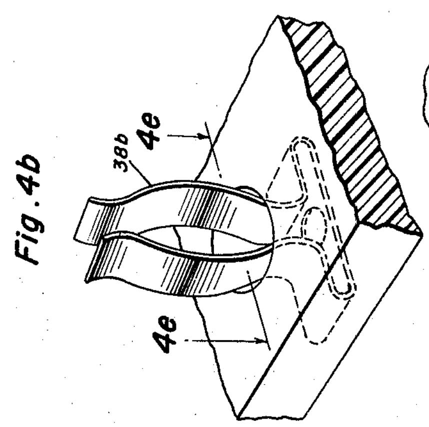

FIGURE 4*b* is a perspective view showing a further connector.

Figure 4E:
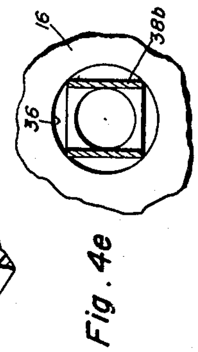
Figure 4D:
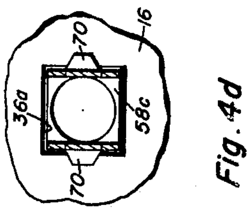
Figure 4C:
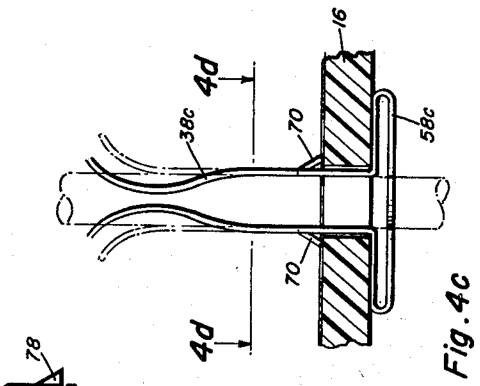

FIGURE 4*c* is a sectional view showing a still further modification.

FIGURE 4*d* is a view taken on line 4*d*—4*d* of FIGURE 4*c*.

FIGURE 4*e* is a view taken on line 4*e*—4*e* of FIGURE 4*b*.

Figure 4G:
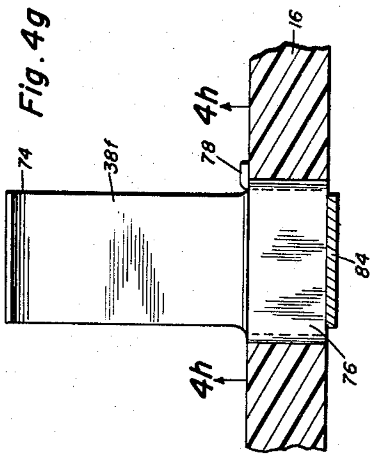
Figure 4H:
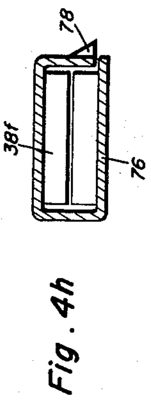
Figure 4I:
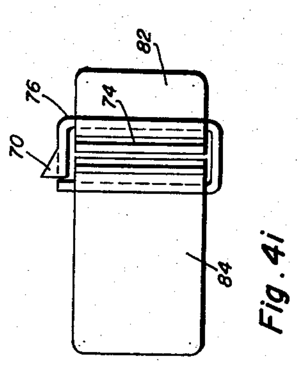
Figure 4F:
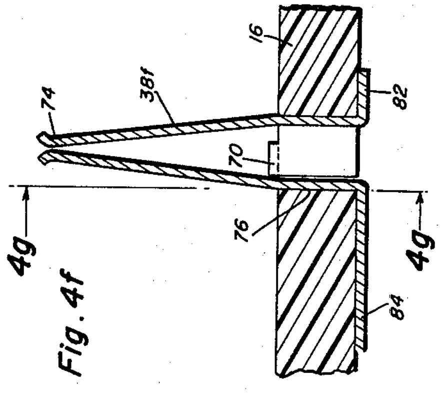

FIGURE 4*f* is a sectional view showing another connector.

FIGURE 4*g* is a sectional view taken on line 4*g*—4*g* of FIGURE 4*f*.

FIGURE 4*h* is a view taken on line 4*h*—4*h* of FIGURE 4*g*.

FIGURE 4*i* is a tip view of the connector of FIGURE 4*f*.

FIGURE 5 is a diagrammatic view showing the application of our system to electronic equipment.

FIGURE 5*a* is a wiring diagram showing specific wiring connections involving the system in FIGURE 5.

*Circuit board assembly*

Figure 1:
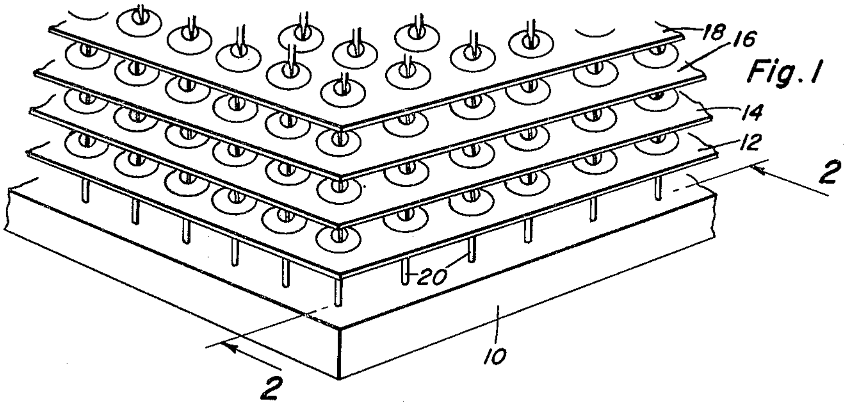
FIGURE 1 is a fragmentary perspective view of an assembly of circuit boards in accordance with the invention.
Figure 2:
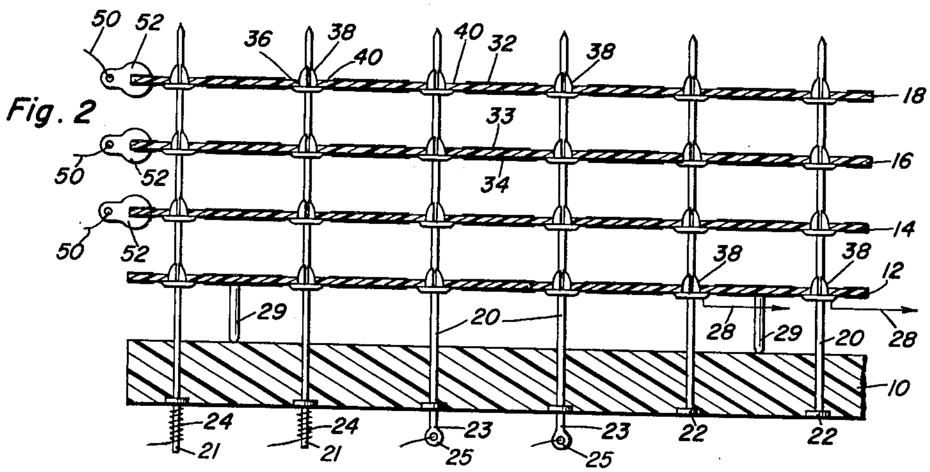
FIGURE 2 is an enlarged fragmentary sectional view taken on line 2—2 of FIGURE 1.

FIGURES 1–4*i* show the assembly and several modifications of connectors. The assembly consists of a base 10 which separably supports one or more circuit boards, for example, boards 12, 14, 16 and 18 (FIGURES 1 and 2). Base 10 is made of insulating material such as plastic, and it has a plurality of parallel pins 20 rigidly fixed thereto. The pins are conductive and may be plated with a precious metal to minimize corrosion problems. The pins are secured to the base by any suitable means such as being driven or molded therein, staked, etc. In our assembly the pins are assumed to receive input signals, although they could just as easily be used to conduct output signals. To facilitate description, assume that the pins are electrically driven by signals from external circuits thereby requiring terminal connections.

FIGURE 2 shows three ways of establishing terminal connections to the pins, and it is immediately evident that numerous other methods my be used. In the simpler methods, each pin is formed with a flange 22 countersunk in a surface of base 10 to assure firm anchoring of the pins, and the two pins to the left of FIGURE 2 have portions 21 projecting beyond the lower surface of base 10. The pin portions 21 are terminals for wire-wrap 24, where the wires thereof are assumed to be connected to individual driving circuits. The adjacent two pins in FIGURE 2 have projecting portions 23 with solder tabs 25 to which wires are soldered. The two pins to the right of FIGURE 3 are blind, but the driver signals are applied by way of circuit board 12. Signal input wires 28 are connected to the connectors 38 of circuit board 12 and these are in contact with two of the pins. When a circuit board (12) is reserved for input signals it can have a wire harness containing one conductor 28 for each connector 38, and each connector 38 will engage one of the pins 20 when the circuit board is inserted on the pins. However, in most equipment the input signal connections to the pins 20 are permanent and therefore soldering, or wire-wrap will be used. However, taper pins and sockets (where the base-supported ends of the pins are formed as (or connected to) sockets to receive tapered pins as for example in U.S. Patent No. 2,978,667) can be used.

Although FIGURES 1 and 2 show only four circuit boards in stacked, parallel, spaced relationship on the array of pins 20, any number can be used. Board spacing can be maintained by human judgment, or by spacers such as placing insulating sleeves over a few pins after inserting each board, by studs 29 attached to each board, or by relying on the connectors of adjacent boards contacting each other, etc. Boards 14, 16 and 18 are conventional printed circuit boards. Board 18 has conductive film 32 on only one side thereof and circuit board 16 has conductive films 33 and 34 on both sides, merely to illustrate the alternatives. The boards have apertures 36 with the spacing the same as the spacing between pins 20. Connectors 38 are inserted in the apertures. There are two procedures which can be followed: All of the apertures of each board can have a connector, or a connector can be provided at only those apertures where the associated pin 20 is expected to be used. The former alternative is shown in FIGURE 2.

Components such as resistors, capacitors, diodes, transistors, etc. have one lead attached to circuit boards and the other to the connectors 38 (see FIGURE 4). In a special case such as shown in FIGURE 5 (described later) the entire film on one (or both) surface of the circuit board is a common for all of the components. Therefore the conductive film covers the entire area of a circuit board, for instance board 18 except for spaces 40 which are immediately adjacent to and surrounding each aperture 36 so that connectors 38 do not touch the conductive film 32. Instead, one end of a typical component 42 (FIGURE 4) is soldered or otherwise attached to a connector 38 and the other end is soldered to the common 34. FIGURE 4 also shows that other conventional techniques can be resorted to, such as connecting a component 44 to the connector and passing one lead through a hole 46 in the board so that it can be fastened to a conductive film on the opposite side of the circuit board.

To this point we have described how the individual circuit boards can be formed, components attached to the connectors and to the common conductive films, and then the boards inserted onto the array of pins 20. The input signals are applied to the pins and these pass through the connectors, any components connected to the connectors, and the common conductive films of the various boards. The output signals can be taken from the circuit boards in a number of ways, perhaps the simplest being by using flying leads 50 (FIGURE 2) which are soldered to conventional edge connectors 52 that are attached to the circuit boards. The edge connectors can afford solder tabs as shown or other configurations which are known in the art.

Since it has been assumed that the input signals are made by permanent connections to the pins 20, it is possible to select a given sub group of pins 20 for specific circuit boards. This is shown in FIGURE 3 where boards 14*a*, 16*a* and 18*a* are engaged with different sub groups of pins 20*a*. Thus, the circuit boards 14*a*–18*a* will receive different groupings of input signals although most of the input signals for each of the three boards are common to each other. This feature has general application, and a specific use is shown (FIGURE 5) which will be discussed later.

FIGURES 3*a* and 3*b* show some of the flexibility which the assembly offers. For instance, some pins can be shorter than others as at 20*b* and 20*c*. Other pins 20*d* can terminate short of the base, interconnecting two or more boards and no others. The boards can be made as large as the base, or larger to engage pins of two or more bases (not shown), or they can be made smaller than the base, as at 14*b* and 14*c* to be coupled to completely different subgroups of pins. FIGURE 3*b* shows that base 10*b* can be made in part like a circuit board, and in part with pins 20*e*. This view also shows groups of boards in tiers, and the possibility of making one or more through connections (pin 20*f*) between tiers. These alternatives are to demonstrate the flexibility of the assembly and are to be considered as examples only. There are many other ways that the assembly can be made.

FIGURES 4–4*i* are included herein principally to show that we can use any suitable kinds of connector in our system. Connector 38 is a conventional three-leaf grommet connector which automatically locks in place when inserted in a hole. The connector 38 has a collar 58 at one end which seats against one surface of board 16. The contacts 59 and 60 of this connector are resilient metal leaves attached at their lower ends near the central aperture of collar 58 and are of sufficient length to project an appreciable distance through aperture 36. Each leaf has an outwardly bowed portion which shoulders against the upper edge of aperture 36 to cooperate with collar 58 to retain the connector fastened to the circuit board. When the circuit board is inserted on the array of pins 20, the connector leaves flex outwardly and grip the pins firmly to both mechanically (frictionally) hold the circuit board in place on the array of pins and to establish electrical continuity across the pins and connectors. The connectors can have some lateral play in the apertures 36 so that they will be automatically self-centering when a circuit board is inserted onto the array of pins, or they can fit tightly as shown.

FIGURE 4*a* shows connector 38*a* which differs from the connector 38 in only a few particulars. The connector is held fastened to the circuit board by shouldering against the upper and lower surfaces of the circuit board. The outer extremities 64 of the two illustrated leaves are curved away from the pin to afford a large contact area between the leaves of the connector and a pin 20. This type of connector can be made with two, three or more leaves. Further, I have shown centering prongs 66 which project outwardly of the leaves at the juncture of the leaves with the flange of connector 38*a* to center the connector in its aperture.

FIGURES 4*c* and 4*d* show another type of connector 38*c* where the base 58*c* of the connector is made of two joined loops functioning as a spring. Small prongs 70 are struck outwardly from the lower parts of the leaves of connector 38*c* so that they shoulder against one surface of the circuit board preventing withdrawal of the connector in one direction. Withdrawal of the connector in the opposite direction is prevented by the base 58*c* contacting the lower surface of the circuit board. Prongs such as at 70 can be used on any of the illustrated connectors and to emphasize that this is an alternative shouldering feature, FIGURE 4*b* shows connector 38*b* which is the same as connector 38*c* except prongs 70 are omitted.

FIGURES 4*e* and 4*d* also show another variation where the aperture 36 is circular and the aperture 36*a* is polygonal. We can use round, square, rectangular, etc. apertures in the circuit boards and furthermore, pins 20 can be round, square, rectangular, etc. in cross section.

FIGURES 4*f*–4*i* inclusive show a still further connector 38*f* which is rectangular in cross section and has two leaves whose upper parts turn outwardly as at 74 and whose major portions of the leaves taper from a base 76 inwardly toward the out-turned portions 74. This provides a comparatively long shank for flexure of the leaves of the connector. Base 76 is a rectangular body (FIGURE 4*h*) of a size to fit snugly within the aperture in the circuit board, and one or more sides of the body are capable of flexing inwardly so that prong 78 can be passed through the aperture in the board after which the body 76 will return outwardly so that the prong 78 overlies and shoulders against the top surface of the circuit board (FIGURE 4*g*). The lower flange of this connector is made in two parts 82 and 84 that project laterally outwardly from the center line of the connector and engage the lower surface of the circuit board. This form of connector is especially well suited for a rectangular (in cross section) pin 20 and may be provided with a soldering tab, for instance on part 84 to facilitate connection of one of the leads of a component thereto. It will be noted that connector 38*f* has leaves which are flexed outwardly with the upper edge of the aperture being the fulcrum, whereas other illustrated connectors flex from the juncture of the leaves with the base at the lower edge of the aperture (FIGURE 4) or throughout the entire body (FIGURE 4*b*) of the connector. There are many other possible variations. For example, small garter springs can be used around nearly all of the connectors, for instance around the ends 64 of connector 38*a*, to enhance the frictional grip between a pin 20 and the connector. In place of a through-connector, we could stake in or otherwise attach resilient leaf connectors to one surface of a circuit board adjacent to each aperture 36. Since the connectors are made of conventionally used resilient metal, for example beryllium copper, the inherent resilience of the connectors is sufficient to establish reliable connections between the connectors and pins.

*Equipment using system*

FIGURES 5 and 5*a* diagrammatically show one possible use of our system, although it is to be understood that this use is given by way of example only. Equipment design can certainly tolerate laborious assembly methods where each piece of equipment requires only one or two circuit boards. However, modern electronic equipment sometimes requires hundreds or thousands of circuits boards. Digital computers and reading machines are good examples. The Rabinow pending application Serial No. 115,267 discloses a reading machine which may be referred to for a complete understanding of its operation. For our purpose, though, FIGURES 5 and 5*a* are sufficient to illustrate how the invention materially expedites manufacture of that machine, effecting substantial economy in both fabrication and trouble-shooting.

FIGURE 5 shows a full mosaic examination device 90 made of seven rows (1–7) and five columns (*a*–*e* inclusive) of photocells. The image of the character "F"

is projected onto the examination device 90 at exactly the center thereof so that no part of the character image falls in rows 1 and 7 and columns *a* and *e*. The outputs of all of the photocells are amplified individually at 92 (separate amplifiers shown in FIGURE 5*a*), and the individual outputs of the various amplifiers are conducted on the wires of cable 94 (identified in FIGURE 5 according to position of the examination device 90) to pins 20 by wire-wrap at 24 (FIGURE 2), solder tabs 25, or any other method. Printed circuit board 18 is inserted over and onto the pins 20 in the sub-group which has pins 2*b*, 3*b*, 4*b*, 5*b*, etc. as completely identified in FIGURE 5*a*. The position of the circuit board 18 corresponds to the position in the examination device 90 framed at 91 by heavy lines. The circuit board 18 has resistors connected as shown, where the common 32 is diagrammatically shown as a bus in FIGURE 5*a*. The circuit board resistors as connected, form a resistor correlation matrix for the letter "F." As disclosed in the Rabinow pending application, the image of the letter "F" could have been high or low when examined. Thus, we have correspondingly positioned high and low circuit boards to correspond to these possible positions and they would be attached like the board 18 but at one station higher and one station lower respectively on the pins of base 10. The same philosophy is followed for additional positions left and right, upper left and lower left, lower right and upper right (FIGURE 3). These latter alternatives are indeed possibilities, although reading machine design can be such that only one direction of displacement (up and down or left and right) usually requires compensation.

The referred to application mentions what is called "assertion" and "negation" techniques. The only bearing that assertion and negation techniques have on the example is that the number of circuit boards may be increased. Separate circuit boards can be used for the "assertions" (sub-areas corresponding to those of examination device 90 where the character is expected) and negations (sub-areas where portions of the character must not fall). Six or more circuit boards are practical to identify the letter "F." An equal number of circuit boards will be required for every other character of the alphabet and each of the numbers 0–9 inclusive. Thus, for the correlation section alone many connections are required between resistors and input signals (conductors of cable 94), and output commons (one shown at 32 in FIGURES 5 and 5*a*). The output signals from each common 32 are conducted over lines 96 to a comparator which summarizes the signals from all of the matrix circuit boards for the character-identity as disclosed in the pending application. Incidentally, that application refers to other reading machines such as Patent No. 3,104,369 which may also be constructed by using our system.

The specific example given at the early part of this disclosure is now more readily understandable. If the reading machine is designed to identify fifty different characters, and symbols, and each character will require six resistor matrices in the correlation section alone, ordinary assembly technique will require three hundred edge connectors whereas our system requires only fifty assemblies such as the one shown in FIGURE 5. Further, FIGURE 5 shows only fifteen connectors of the circuit board being used. Ordinarily this number is far too small for a reading machine capable of identifying alpha-numeric characters. Thus, where we connect at least fifteen (as shown) and in a practical case far more, resistors in circuit by simply sliding the circuit board in place on the array of pins, a conventional edge connector will require manual insertion of two pins per point in an edge connector after manually making up jumpers with taper pins at the ends. This is to say nothing of the other advantages of being able to relate the position of the matrix boards with the high, low, etc., positions of the character image being examined and also, the fact that the boards can be readily identified because the arrangement of resistors corresponds to the shape of the character for which it stands.

It is understood that many changes and modifications may be made without departing from the protection of the following claims.

We claim:

1. In electronic equipment providing a plurality of signals from a total array of sources wherein said array includes a significant set of sources smaller than the total array and wherein the significant set can occupy one of a plurality of possible positions in the array, a base, a plurality of pins attached to said base, there being one pin for each source of said total array, means connecting the respective sources of said array to the respective pins, a plurality of circuit boards having components thereon, each circuit board having a set of apertures of a spacing to receive some of said pins, the circuit board apertures being equal in number to the number of sources of said significant set of sources within said total array so that one board corresponds to a said significant set of sources, at least two of said circuit boards being positioned on said plurality of pins at different lateral positions which correspond respectively to two of the possible positions which said significant set of sources may occupy in said array, and means connecting the pins in circuit with the components of the respective boards.

2. The subject matter of claim 1 wherein said board apertures have connectors by which to couple the boards to said pins in a stacked arrangement, said boards having conductors adhered thereto, and said components being connected between said connectors and said conductors.

3. The subject matter of claim 2 wherein the signals of a said set within said total array bear spatial relationship to a character represented by said set of signals, and the location of components on one of said boards forming a visual representation of the same character.

References Cited by the Examiner

UNITED STATES PATENTS

| | | | |
|---|---|---|---|
| 2,774,014 | 12/56 | Henry | 317—101 |
| 2,885,602 | 5/59 | Emerson et al. | 317—101 |
| 2,899,676 | 8/59 | Rivers et al. | 340—166 |
| 2,913,634 | 11/59 | Scoville | 317—101 |
| 2,931,003 | 3/60 | Huetten et al. | 317—101 |
| 2,943,312 | 6/60 | Von Kummer et al. | 340—166 |
| 2,967,285 | 1/61 | Freitas | 339—18 |

FOREIGN PATENTS

| | | |
|---|---|---|
| 814,757 | 9/51 | Germany. |
| 233,658 | 4/61 | Australia. |

NEIL C. READ, *Primary Examiner.*

E. JAMES SAX, *Examiner.*